United States Patent [19]

Kamdar

[11] Patent Number: 5,636,132

[45] Date of Patent: Jun. 3, 1997

[54] METHOD AND APPARATUS FOR CONSTRAINING THE COMPACTION OF COMPONENTS OF A CIRCUIT LAYOUT

[75] Inventor: Ajay D. Kamdar, Somerset, N.J.

[73] Assignee: Mentor Graphics Corporation, Wilsonville, Oreg.

[21] Appl. No.: 343,819

[22] Filed: Nov. 22, 1994

[51] Int. Cl.⁶ .................................. G06F 15/00
[52] U.S. Cl. ................ 364/491; 364/488; 364/489; 364/490
[58] Field of Search ................ 364/488, 489, 364/490, 491, 578, 474.24, 570, 148, 151, 581, 580, 468.28, 468.2; 395/2, 2.1, 22, 250, 500, 13, 921; 257/208, 211, 369; 326/39, 41, 50, 101; 437/51, 25

[56] References Cited

U.S. PATENT DOCUMENTS

| | | | |
|---|---|---|---|
| 4,669,097 | 5/1987 | Bristol | 364/570 |
| 4,942,536 | 7/1990 | Watanabe et al. | 364/490 |
| 5,267,177 | 11/1993 | Sato et al. | 364/490 |
| 5,363,313 | 11/1994 | Lee | 364/489 |
| 5,381,343 | 1/1995 | Bamji et al. | 364/488 |
| 5,410,496 | 4/1995 | Bolon et al. | 364/474.24 |
| 5,465,218 | 11/1995 | Handa | 364/489 |
| 5,510,998 | 4/1996 | Woodruff et al. | 364/489 |
| 5,513,118 | 4/1996 | Dey et al. | 364/489 |

OTHER PUBLICATIONS

*Physical Design Automation of VLSI Systems*, Bryan Preas and Michael Lorenzetti, Ch. 6, pp. 211–281, The Benjamin/Cummings Publishing Company, Inc., Jan. 1988.

*GDT Generator Creation and Compaction Manual*, Mentor Graphics Corporation, Dec. 1991.

*Algorithms for Circuit Layout Compaction of Building Blocks*, Ramachandran Varadarajan, Master of Service Thesis, Texas Tech. University Dec., 1985.

*Symbolic Layout and Procedural Design*, A.R. Newton, Jan. 1987.

*Primary Examiner*—Kevin J. Teska
*Assistant Examiner*—Jacques Louis-Jacques
*Attorney, Agent, or Firm*—Klarquist Sparkman Campbell Leigh & Whinston, LLP

[57] ABSTRACT

Integrated circuit design method and apparatus with user defined constraints for constraining compaction of an integrated circuit layout. Logical boundary constraints allow a user to move layout designs to different process technologies without concern that device size changes will disrupt the layout. Multiple grid constraints allow a user to set grids of different sizes for the same or different circuit layers in a design. And pre-compaction constraints may be imposed by a user to preserve components' relationships in an initial topology throughout the compaction process.

19 Claims, 12 Drawing Sheets

Equality Constraint to align the left edges of c1 and c2

Equality Constraint to align the left edges of c1 and c2

Equality Constraint to align the left edges of c1 and c2

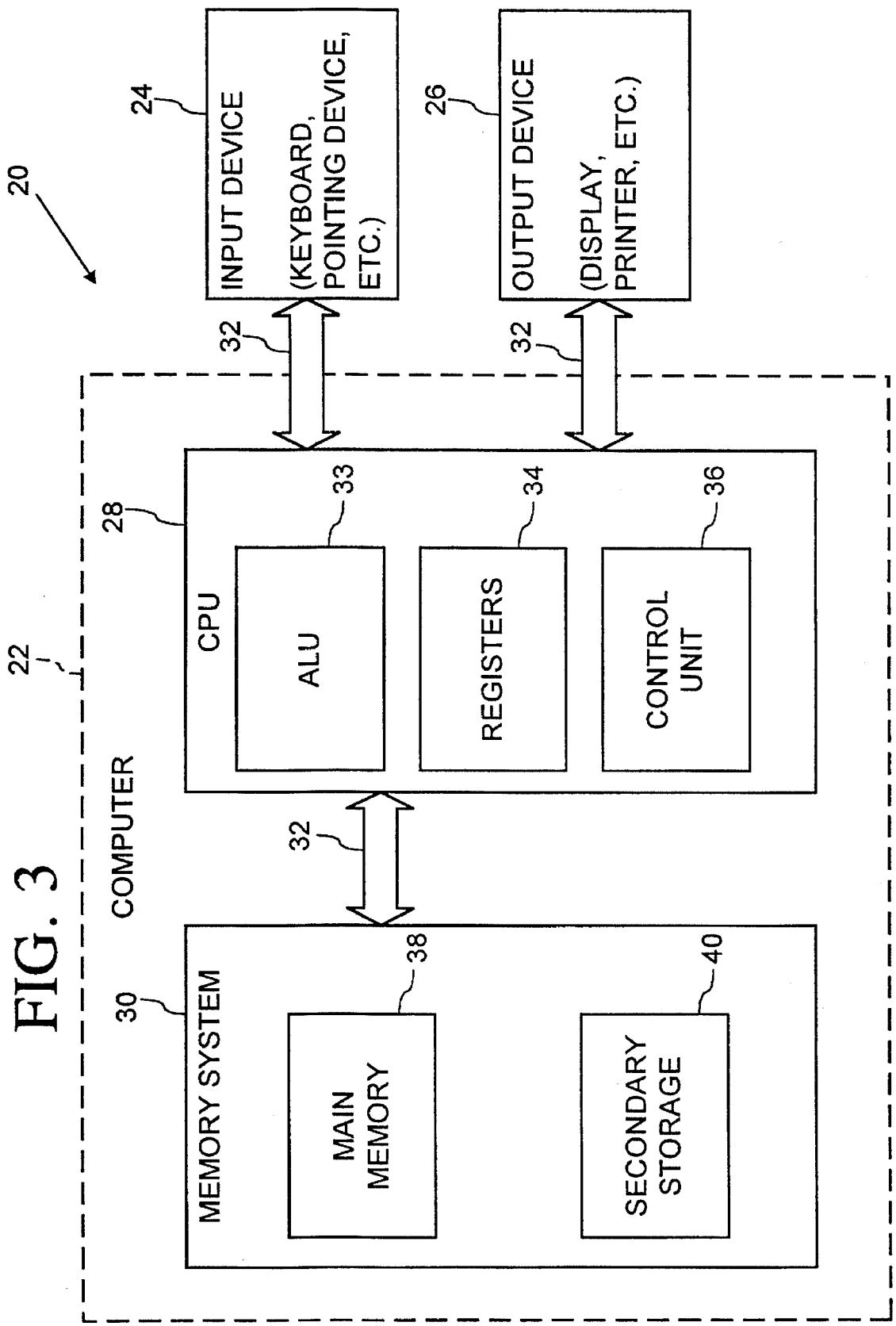

Minimum
Constraint
B - A >= d

Maximum
Constraint
B - A <= d

Equality
Constraint
B - A = d

Equality Constraint
represented as a pair of
Minimum and Maximum
Constraints
B - A >= d
B - A <= d Left Logical Boundary constraint on center of c0

Left Logical Boundary constraint on center of c1

Left Logical Boundary constraint on center of c0

Left Logical Boundary constraint on center of c1

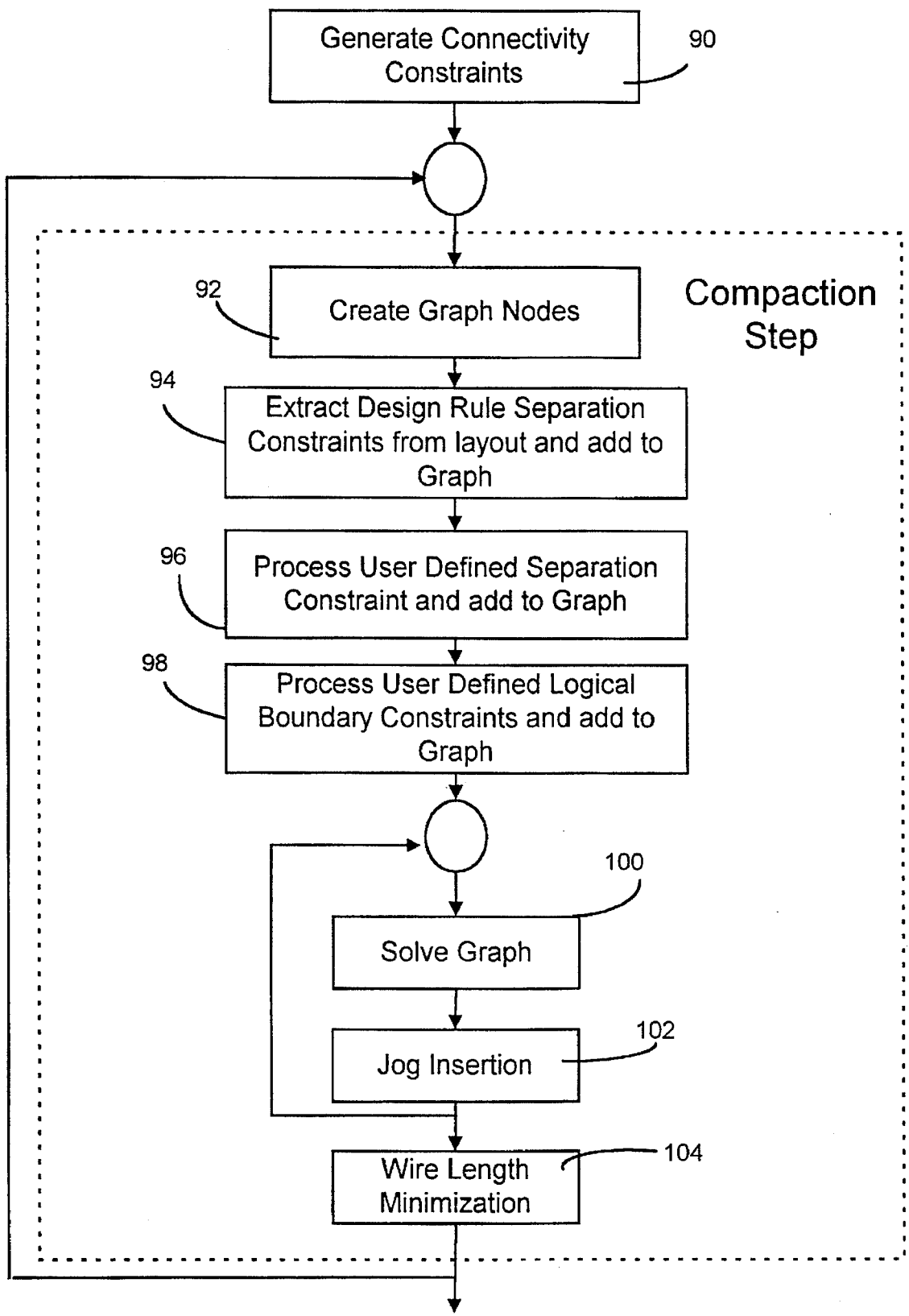

METHOD AND APPARATUS FOR CONSTRAINING THE COMPACTION OF COMPONENTS OF A CIRCUIT LAYOUT

FIELD OF THE INVENTION

This invention relates to computer-based design automation of electrical circuits. More particularly, this invention relates to integrated circuit design method and apparatus for compacting, or reducing, the size of an integrated circuit layout with user-defined constraints.

BACKGROUND OF THE INVENTION

Integrated circuits (ICs) are designed today with computers using a computer program known as an integrated circuit design tool. With this tool, a circuit designer enters symbolic or geometrical shapes representing elements of an integrated circuit design into a computer and manipulates the size and location of the elements to produce a simulated layout of the circuit. The geometrical shapes correspond to circuit elements such as transistors, resistors and capacitors and appear on a computer display screen. These shapes represent a physical layer of material in an integrated circuit such as metal or polysilicon layers, with each material typically shown in a different color. From this simulated layout, the design tool generates data for producing photolithographic masks that are then used for fabricating the integrated circuit.

Layouts may be manually created using an editor, command line or other input means to the design apparatus. Layouts may also be automatically created in certain design apparatus using "generator" technology. This technology strives to capture the steps needed to create a layout in what is called a generator, a user-written computer program defining the layout. A generator can be parameterized to handle different device sizes (such as transistors and via sizes), different number of inputs and outputs, etc. The generator can then be rerun with different parameters to automatically create a new layout. The generator can also be used to generate a layout in a new process technology (technology porting). Generators may be user written or, in newer IC design apparatus, generated by the apparatus from a layout entered graphically by a user.

Some IC design apparatus include a compactor that speeds layout design by automating the task of reducing the design area. A user gives the compactor a preliminary layout. The compactor then moves circuit elements, or components, of the design to optimize for two goals: that the layout be small and that it be design rule correct. The user can therefore have a great deal of control on the layout without performing the tedious work required to turn a sketch of a layout into a correct, space-optimized design.

Compactors are well known in the art and are described in a number of references such as *Physical Design Automation of VLSI Systems*, Benjamin/Cummings Publishing Co., Inc., 1988. Briefly, compactors attempt to reduce the area of an IC design by moving components of the design in one of x or y directions for 1-D compactors, or both x and y simultaneously for 2-D compactors into as close as possible to other layout components without violating design rules. Basic compactors work strictly from separation constraints between layout components, constraints dictated by process design rules and the need to maintain electrical connectivity between connected components. These constraints are met as the design is compacted, first in one direction and then in the other. Consequently, the post compaction configuration, or topology, of the layout may be quite different than the initial topology. More sophisticated compactors allow the user to control the topology of the compacted layout by imposing user defined constraints on the compaction process. These include allowing the user to specify minimum constraints, maximum constraints and equality (alignment) constraints. A minimum constraint limits the closest distance two specified components can be placed apart from each other. A maximum constraint limits the greatest distance two specified components can be placed apart from each other. An equality constraint specifies the exact distance between two layout components. By an appropriate use of these user defined constraints beyond the design rule constraints extracted by the compactor from the layout, a user is better able to control the placement of components in the compacted layout. Compactors may be used with layouts that are manually drawn or layouts that are created with generators.

A physical boundary constraint (PBC) is one form of a user defined equality constraint. However, instead of the constraint being between two layout components, the constraint is specified between a layout component and one of the boundaries of the layout. Physical boundary constraints serve to position a selected edge of a component on a selected boundary of the layout and to prevent the layout component from moving into free space even if the space is available. This constraint is desirable where the position of a component is to be maintained at an area boundary for connectivity or other purposes.

However, physical boundary constraints are not adequate in a generator environment, where a device's size may change because of a change in a generator parameter or because of a change in the process technology. The following example, which refers to FIGS. 1A through 1D, makes this clear. The problem facing the user is to align the centers of these components while placing one or both of them on the left physical boundary of the layout. In FIG. 1A are shown two layout components C0 and C1. The desired result is achieved by placing physical boundary constraints on the left edges of both components so that both edges fall on the left physical boundary constraint. However, if components C0 and C1 were to have different widths, as in FIG. 1B, as a result of changing the generator parameters or porting the design to a different technology, the desired layout would not be achieved. The component centers are no longer aligned in FIG. 1B, although the compaction process still satisfies the specified physical boundary constraints. The user must then intervene to correct the layout.

The problem cannot be conclusively solved by specifying other physical design constraints. The user might specify a physical boundary constraint on component C0 to make its left edge fall on the left physical boundary of the layout and an equality constraint between the centers of C0 and C1. This would appear to achieve the goal, as shown in FIG. 1C. But this pair of constraints works if and only if C0 is wider than C1. If the widths of the two components is reversed, as in FIG. 1D, an impossible layout results. The left edge of C1 extends beyond the left edge of the layout. The problem is said to be overconstrained because the compactor cannot yield a sensible result while satisfying the user defined constraints. If the layout were generator specified, the generation process fails and the designer must intervene manually to correct the problem.

Another constraint of value to users is a gridding constraint. Most compactors allow the user to specify a single x,y grid on which the layout components must fall to meet manufacturing tolerances or routing requirements. When the grid size is specified to the compactor, the layout components are moved during the compaction process to place each component ultimately on the grid. However, prior compactors have only permitted the user to specify a single number for both the x direction and the y direction, or at most one number for the x direction and another number for the y direction. This has been found to be quite limiting because the routing grids are different for routing on different layers of an integrated circuit. For example, in a given fabrication process, the grid for routing a first metal layer might be 5 and the grid for routing a second metal layer might be 6.

None of the constraints discussed above assure that the relative positions of components in an initial topology will be preserved after compaction if device sizes change because of a change in process technology or a change in generator parameters. This can lead to unexpected and undesirable compaction results. For example, FIGS. 2A–2E show what can unexpectedly happen with prior compactors. FIG. 2A shows the initial topology of a layout. It is desired to compact the layout, which the compactor does first in the y (down) direction and then in the x (left) direction. As shown in FIG. 2B, components C0 and C1 move downward until they are separated by design rule constraints, and C3 moves leftward until it is separated from C1 and C2 by such constraints. An equality constraint to align the left edges of C1 and C2 is met prior to compacting. FIG. 2C shows the layout when, due to a generator parameter change of technology port, the size of C1 shrinks. The equality constraint must now be met through the compacting. The compactor compacts the layout first in the down direction, as shown in FIG. 2D, moving C0 to the left of C1. The layout is then compacted in the left direction, as shown in FIG. 2E, moving C0 further to the left to avoid C1 as C1 moves to satisfy the equality constraint. The result is a layout area larger in width than necessary, since there is room for C0 above C1 if C0 had not been moved.

Accordingly, an object of the invention is to provide a design apparatus and method that overcomes the limitations of prior compactors. More particularly, an object of the invention is to provide such method and apparatus that permits logical boundary constraints, multiple grid constraints or pre-compaction constraints on compacting to improve the resulting design.

SUMMARY OF THE INVENTION

The invention introduces new types of user defined constraints which allow users to control their design. These constraints communicate to the compactor requirements that are not available in the connectivity or separation constraints of the layout but are nonetheless important for the successful use of the compactor. With these novel constraints, it is feasible to capture a designer's layout as a non-procedural parameterized "generator" which can be reused again and again automatically to create new layouts with different parameters or to create new layouts in different technologies.

The foregoing and other objects, features, and advantages of the invention will become more apparent from the following detailed description of a preferred embodiment and the accompanying drawings.

BRIEF DESCRIPTION OF THE DRAWINGS

FIG. 3 is a block diagram of a computer system that may be used to implement a method and apparatus embodying the invention.

FIG. 8 is a flowchart of a method embodying the invention for implementing logical boundary constraints in a compaction process.

DETAILED DESCRIPTION OF A PREFERRED EMBODIMENT

Figure 1A:
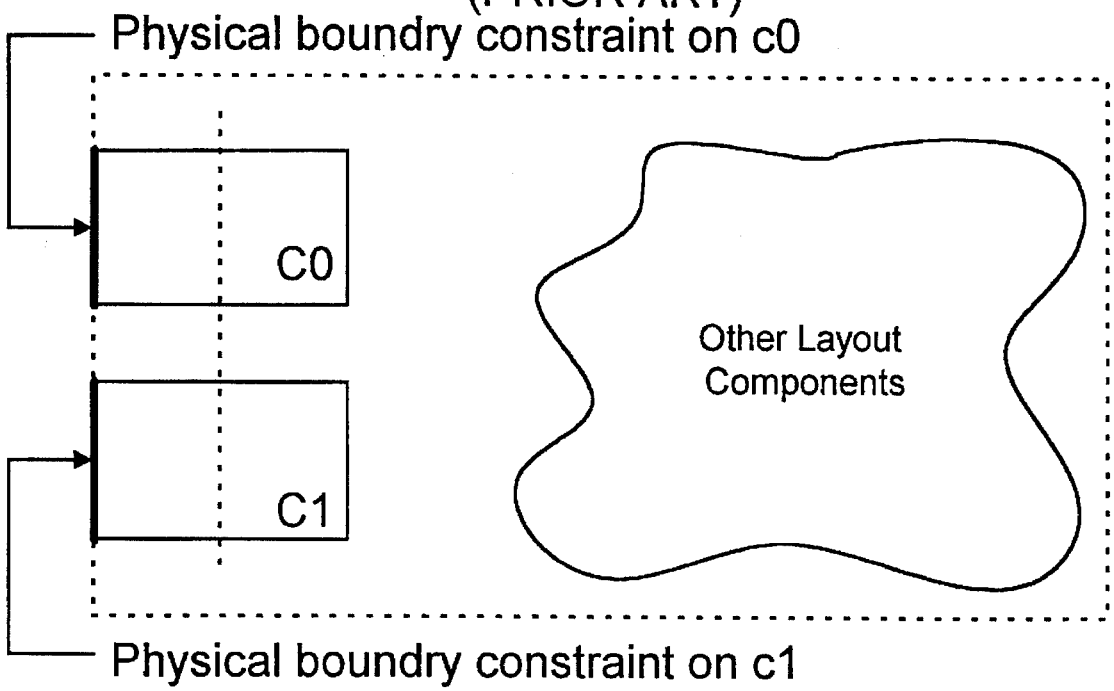
FIGS. 1A–1D show one example of a compaction problem in prior art compactors.
Figure 1B:
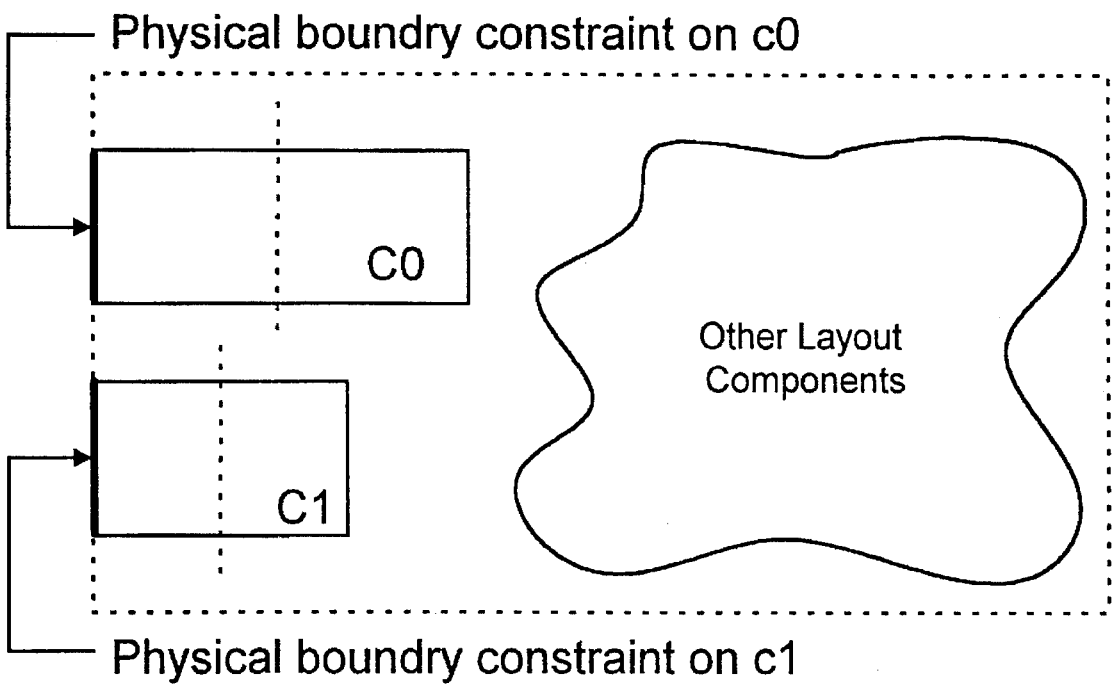
Figure 1C:
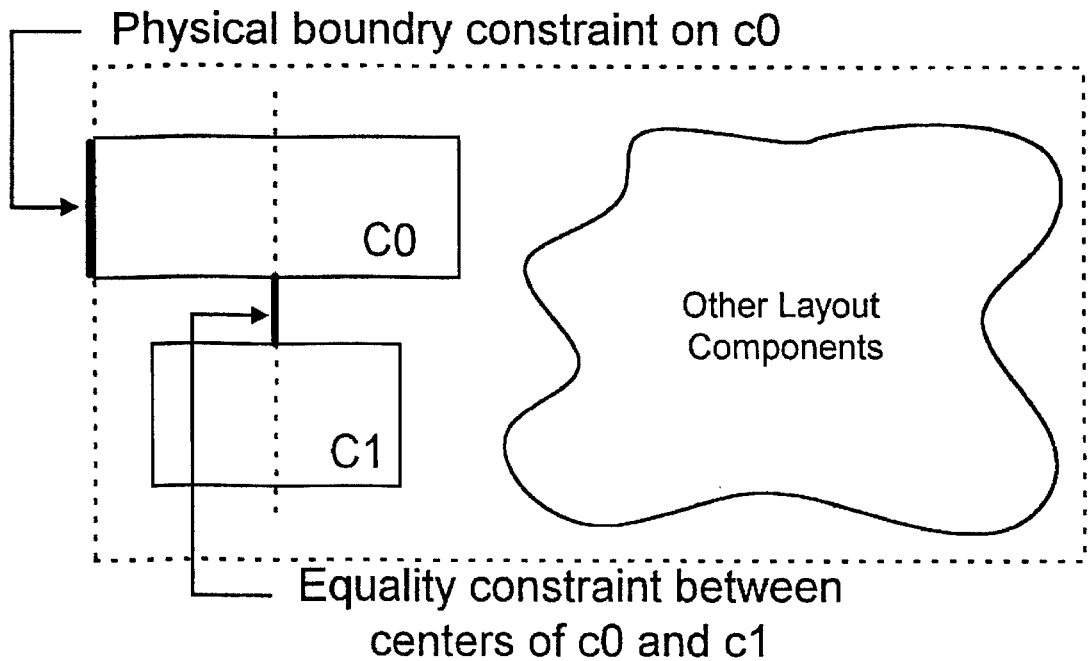
Figure 1D:
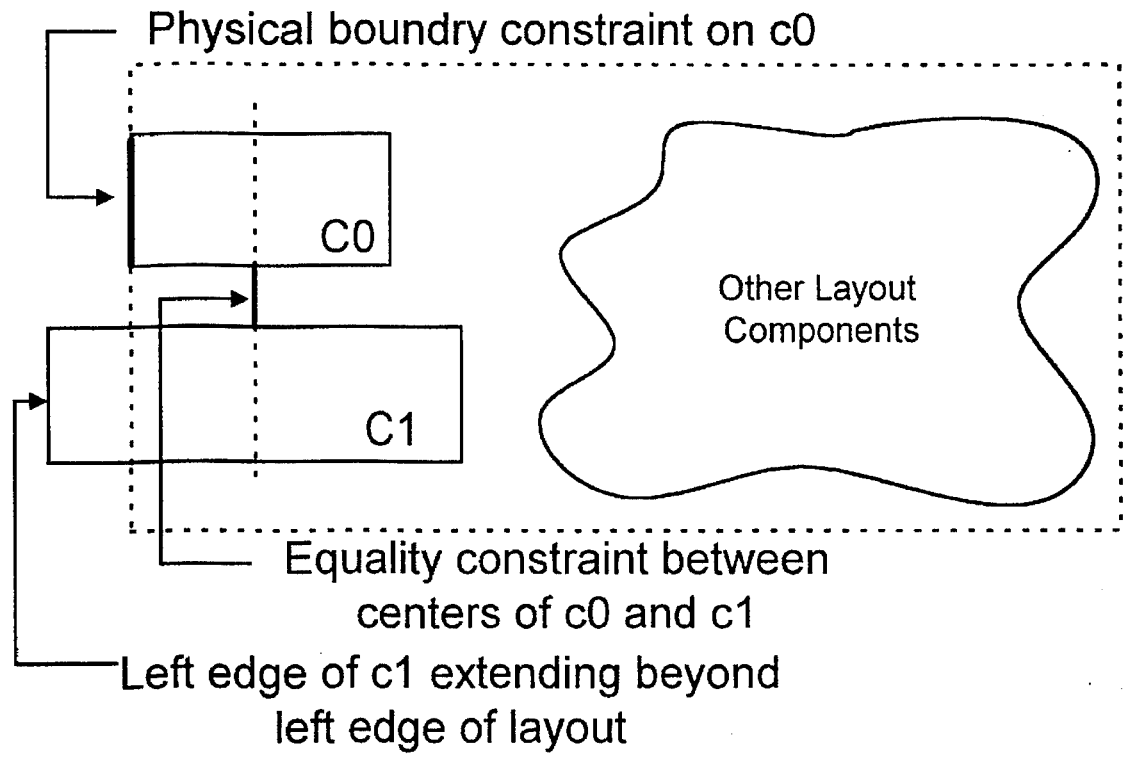

FIG. 3 is a block diagram of a computer system 20 which is used to implement an integrated circuit design method and apparatus embodying the invention. Computer system 20 includes as its basic elements a computer 22, input device 24 and output device 26.

Computer 22 generally includes a central processing unit (CPU) 28 and a memory system 30 that communicate through a bus structure 32. CPU 28 includes an arithmetic logic unit (ALU) 33 for performing computations, registers 34 for temporary storage of data and instructions and a control unit 36 for controlling the operation of computer system 20 in response to instructions from a computer program such as an application or an operating system.

Memory system 30 generally includes high-speed main memory 38 in the form of a medium such as random access memory (RAM) and read only memory (ROM) semiconductor devices and secondary storage 40 in the form of a medium such as floppy disks, hard disks, tape, CD-ROM, etc. and other devices that use optical or magnetic recording material. Main memory 38 stores programs such as a computer's operating system and currently running application programs. Main memory 38 also includes video display memory for displaying images through a display output device 26.

Input device 24 and output device 26 are typically peripheral devices connected by bus structure 32 to computer 22. Input device 24 may be a keyboard, modem, pointing device, pen, or other device for providing input data to the computer. Output device 26 may be a display device, printer, modem, sound device or other device for providing output data from the computer. The input and output devices may be physically combined into a single device if desired.

It should be understood that FIG. 3 is a block diagram illustrating the basic elements of a computer system 20; the figure is not intended to illustrate a specific architecture for a computer system 20. For example, no particular bus structure is shown because various bus structures known in the field of computer design may be used to interconnect the elements of the computer system in a number of ways, as desired. CPU 28 may be comprised of a discrete ALU 33, registers 34 and control unit 36 or may be a single device in which these parts of the CPU are integrated together, such as in a microprocessor. Moreover, the number and arrangement of the elements of the computer system may be varied from what is shown and described in ways known in the art (i.e., multiple CPUs, client-server systems, computer networking, etc.).

The compaction processes of the invention can be implemented in compaction system 20 with various techniques, such as the constraint graph algorithm or virtual grid algorithm described in *Physical Design Automation of VLSI Systems* and other references. The preferred embodiment uses terminology and examples of the constraint graph algorithm. However, the invention is implementation independent and can be implemented using other compaction algorithms as well.

Figure 4A:
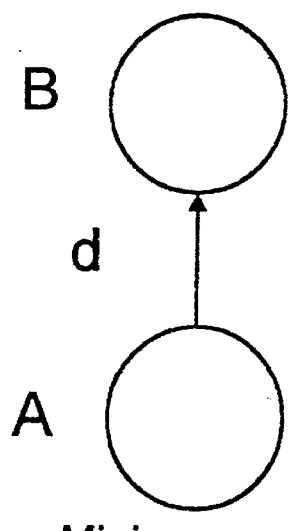
FIGS. 4A–4D are visual representations of constraints in a constraint graph algorithm.
Figure 4B:
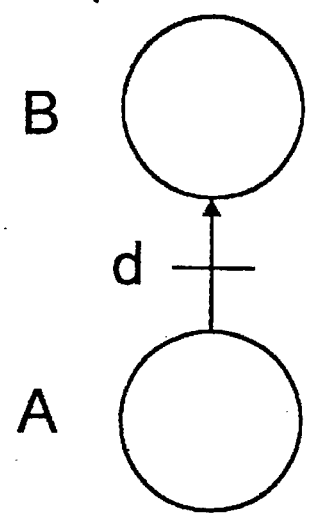
Figure 4C:
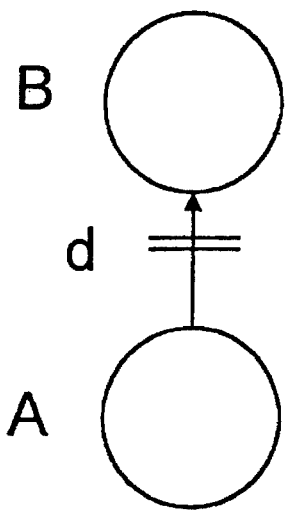
Figure 4D:
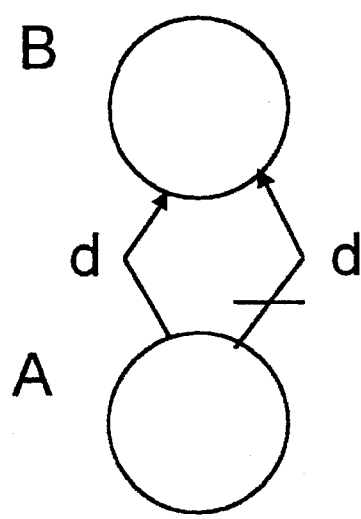

In the constraint graph algorithm, the layout components are represented as nodes in a constraint graph and the constraints between the components are represented as directional arcs between the corresponding nodes in the constraint graph. Each constraint arch is given a weight equal to the value of the constraint. FIGS. 4A–4D are visual representations of constraints in a constraint graph algorithm. The convention used to pictorially represent the constraints, a plain arrow represents a Minimum Constraint (FIG. 4A), an arrow crossed by one line represents a Maximum Constraint (FIG. 4B), and an arrow crossed by two lines represents an Equality Constraint (FIG. 4C). An Equality Constraint is mathematically equivalent to a pair of Minimum and Maximum constraints (FIG. 4D). A Minimum Constraint is used when two components must be at least d units apart. A Maximum Constraint is used when two components must be at most d units apart. And an Equality Constraint is used when two components must be exactly d units apart. It is useful to note that a Maximum Constraint can be represented in a graph in terms of a Minimum Constraint by reversing the direction of the arrow and by negating the value of the constraint. This is true because the equation B-A <=d (the equation of a Maximum Constraint) is equivalent to A-B>=-d (the equation of a Minimum Constraint).

Figure 5:
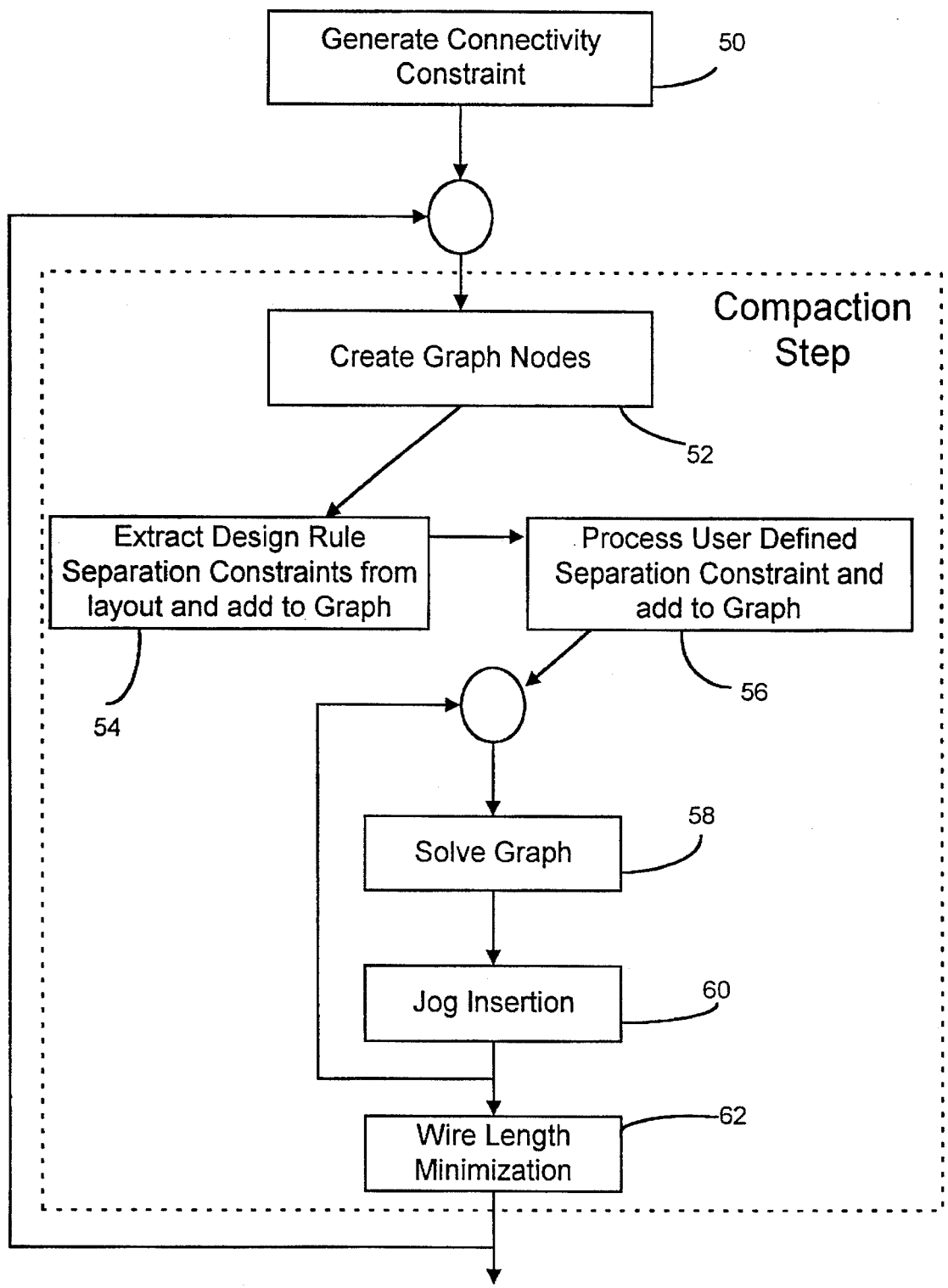
FIG. 5 is a flowchart of a conventional constraint graph compaction method.
Figure 6:
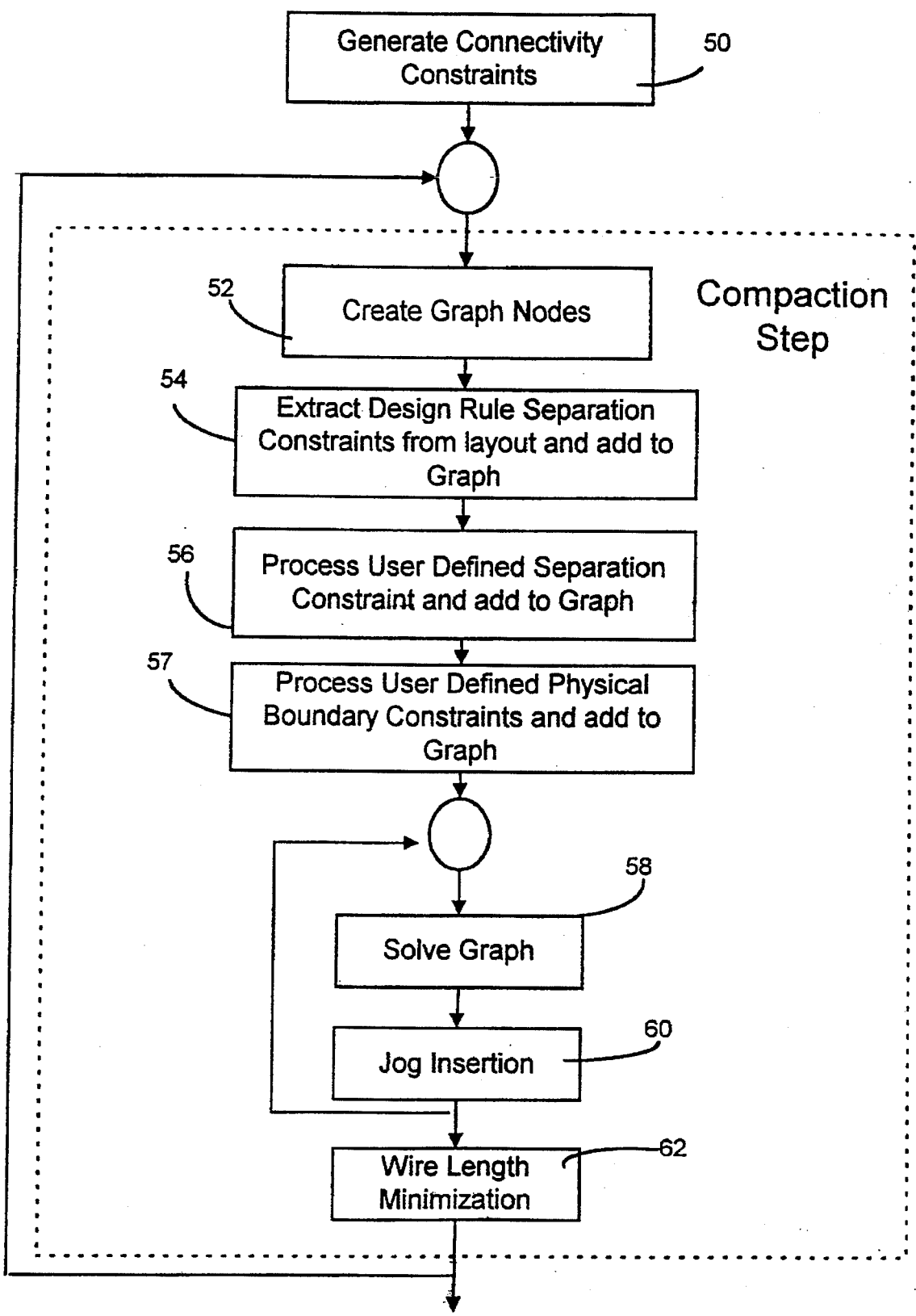
FIG. 6 is a flowchart of a method embodying the invention for implementing physical boundary constraints in a compaction process.

FIG. 5 shows the steps of a conventional compaction process, which is then modified as shown in FIGS. 6, 7 and 8 to implement various aspects of the invention. In FIG. 5 the first step is to determine the physical connections in the layout—which ports need to be remain physically coincident during compaction (50). The compactor is required to maintain connectivity between components that were connected before the start of compaction. The compactor uses Minimum and Maximum constraints to ensure that connectivity is maintained during the compaction process. The process then enters a main loop during which compaction takes place. Each iteration through the loop is a "compaction step." Nodes are created in the graph to represent the layout components (52). Each node is given a value which represents the current position of its corresponding component in the layout. The compactor is also required to bring layout components only as close as that is allowed by the process design rules. To maintain design rule correctness, the compactor analyzes the layout and generates a set of constraints required to ensure that the layout remains spacing rule correct during the compaction process (54). The compactor also processes user defined separation constraints and adds them to the constraint graph (56). As described above, layout components are represented in the constraint graph as nodes and the constraints between components are represented as weighted arcs between the nodes. Spacing constraints as well as user defined Minimum, Maximum, and Equality constraints can be represented in this fashion in the constraint graph. During this graph building phase, two artificial nodes called the source and the sink are added to the graph. The source represents the lowest position in the layout, and all other nodes in the graph are required to be explicitly or implicitly above it. Similarly, the sink represents the highest position in the layout, and all other nodes in the graph are required to be explicitly or implicitly below it.

After the constraint graph has been generated, the compaction process then enters the graph solving phase (58). During this iterative phase, the graph nodes are assigned new values such that all the constraints are satisfied while simultaneously minimizing the distance from the source to the sink. Wire segments may be inserted as needed (60). Assigning these new values to the graph nodes is essentially the process of finding the longest path from the source to each node in the graph (this is called solving the graph in the forward direction.) If wire length minimization is to be performed after the graph is solved, then it is also necessary to find the closest that each node can be to the sink node without violating the constraints and without increasing the distance between the source and the sink that was determined when solving the graph in the forward direction (62). The result of this process is a list of <x, y> positions for all components and wires in the circuit layout. Pseudo-code for a method to solve the graph and for the data structures used in the algorithm are given Appendix A.

Implementation of Physical Boundary Constraints

The following modifications are made to the compaction process to implement Physical Boundary Constraint, as shown in FIG. 6.

A format is defined to enable the user to specify physical boundary constraints in a manner that can be understood by the compactor. The information required to process the physical boundary constraint is: (a) specify the layout component constrained by the physical boundary constraint; (b) specify the edge of the layout involved in the physical boundary constraint; (c) specify the layout boundary (left/right/top/bottom) to which the constraint is set up and (d) specify any required offset from the constrained physical boundary. (If not specified, this defaults to 0.)

A processing step 57 is added to the compaction process to map user defined physical boundary constraints into the constraint graph over and above the processing done for user defined separation constraints. This function maps the user defined boundary constraints into equality constraints each of which is eventually represented in the graph as a pair of Minimum and Maximum constraint.

The pseudo-code for implementing this step is given in Appendix B. With the addition of this processing step 57, physical boundary constraints are implemented by mapping the constraints to a pair of minimum and maximum constraints from the constrained component to the source or the sink of the graph, as determined by the constraint graph. If the physical boundary involved in the constraint is the layout boundary towards which the compaction is being performed, then the constraint pair is added between the graph source node and the node corresponding to the layout component. If the physical boundary involved is the one opposite to the boundary towards which the compaction is being performed, then the constraint pair is added between the layout node and the graph sink node.

Implementation of Logical Boundary Constraints

Each of the physical boundaries of the layout has a corresponding logical boundary. Hence there are left logical, right logical, bottom logical, and top logical boundaries corresponding to the left, right, bottom and top physical boundaries.

A logical boundary is in essence a "soft" physical boundary. By default, the logical boundaries coincide with their physical boundaries. However, when logical boundary constraints (LBCs) are specified by a user, the logical boundaries might be offset from their corresponding physical boundaries. This offset (if any) depends upon the layout components for which LBCs have been specified and the reference point on the constrained component which is referred by the LBC, and can vary from one compaction pass to another. The method which is used to compute the offset between logical and physical boundaries is explained below.

Extending the analogy of a logical boundary as a soft physical boundary, a logical boundary constraint is a soft physical boundary constraint. Physical boundary constraints force one of the edges of the constrained element to be necessarily aligned with the corresponding physical layout boundary. One important difference between a logical boundary constraint and a physical boundary constraint is that a logical boundary constraint may or may not cause the constrained component to have one of its edges aligned with a physical boundary as long as there is at least one other component with a logical boundary constraint which has an edge aligned with the corresponding edge of the layout. Irrespective of whether the component constrained by a LBC has an edge aligned with a layout edge or not, all the reference points of the components constrained by the LBCs to the same boundary are aligned during the compaction process.

The process of computing the offset of a logical boundary from its corresponding physical boundary is essentially the process of finding out which of the constrained components has the largest distance between its constraint reference point and between its own corresponding edge (left/right/top/bottom). Setting the offset to be equal to this maximum offset between a component and its corresponding edge makes sure that the edge of a component never extends beyond the edge of a layout. Aligning the reference point of constrained components makes sure that the "boundary" components are aligned at their desired reference points regardless of whether they became bigger or smaller when rerunning a generator or porting to a new technology. Table I below shows how the offset is computed:

edge of the layout, the reference points of all the constrained elements are aligned with the logical boundary. In this case, that means that the centers (the reference points) of C0 and C1 are aligned with the logical boundary (and hence with each other).

Figure 7A:
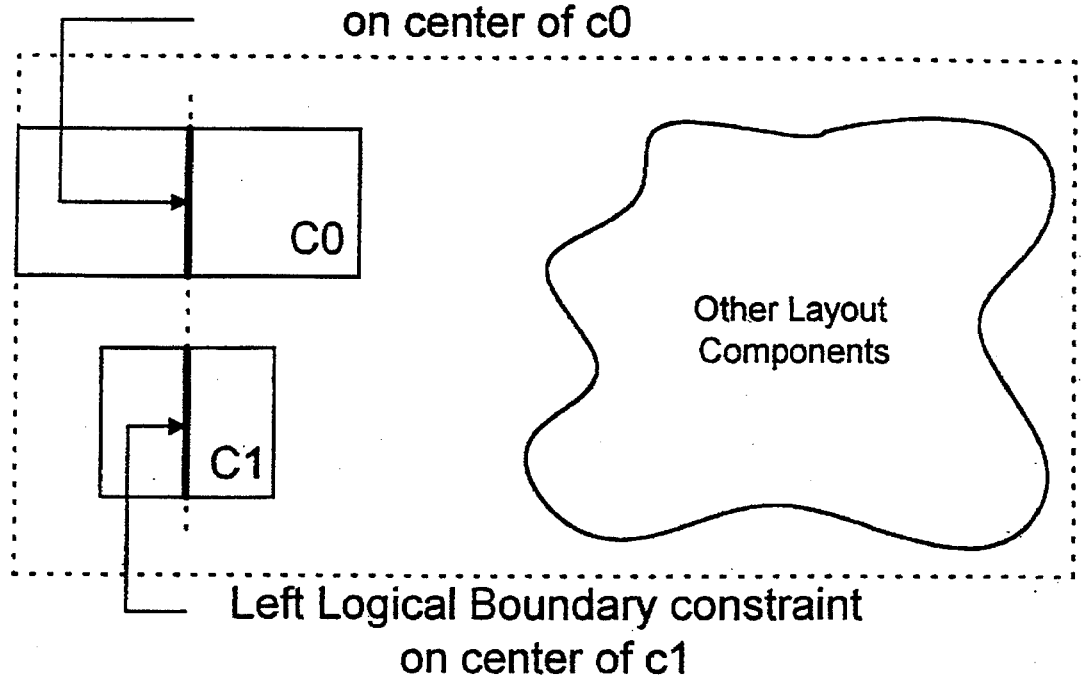
FIGS. 7A–7B illustrate how the present invention uses logical boundary constraints to solve the compaction problem of FIGS. 1A–1D.
Figure 7B:
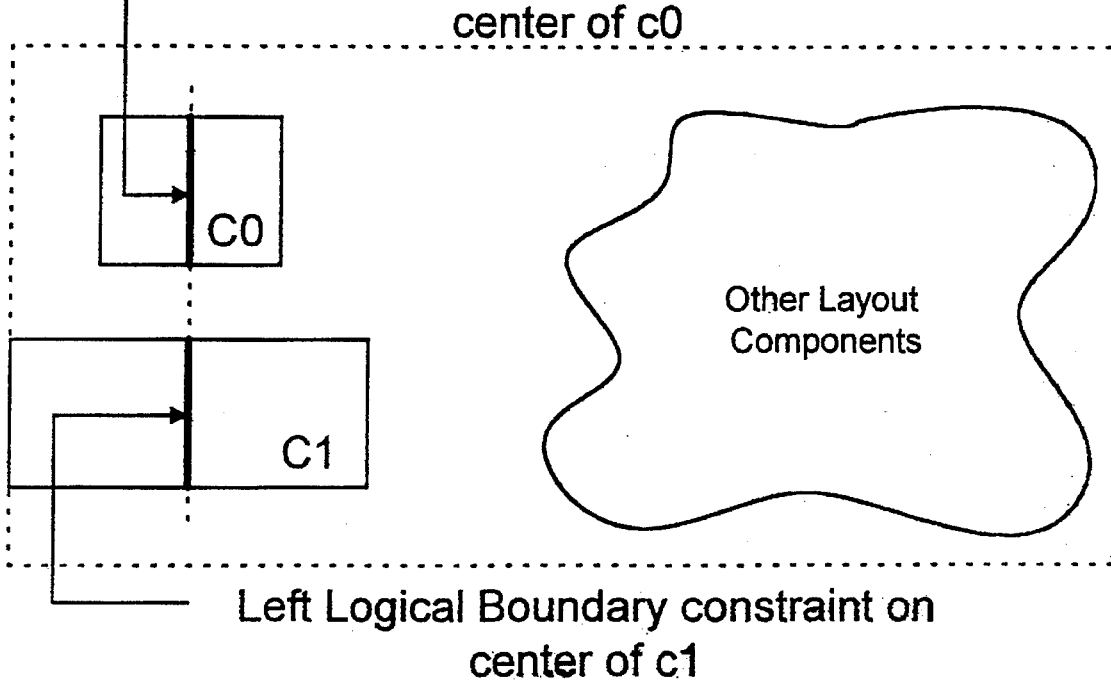
Figure 9:
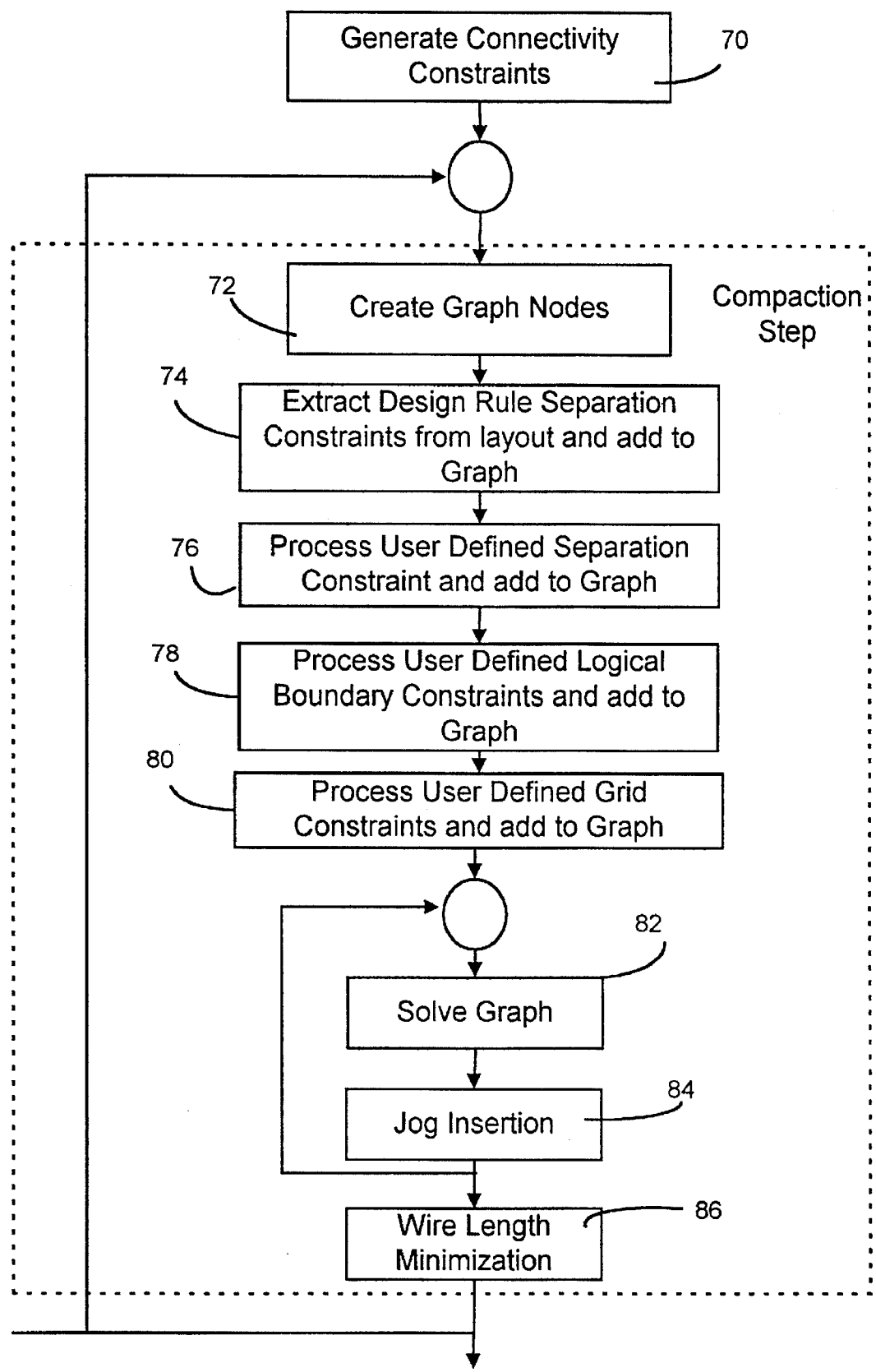
FIG. 9 is a flowchart of a method embodying the invention for implementing grid constraints in a compaction process.

FIG. 7B shows a similar situation, but now with c1 being wider than c0. In both cases, the value of $Offset_{left}$ is different and is determined by the component having the largest distance between its left edge and its reference point.

With reference to FIG. 8, the following modifications are made to the compaction process of FIG. 5 to implement logical boundary constraints.

A format is defined to enable the user to specify logical boundary constraints in a manner that can be understood by the compactor. The information required to process the logical boundary constraint includes the following. The layout component constrained by the logical boundary constraint is specified. The edge of the layout involved in the logical boundary constraint is specified. The layout boundary (left/right/top/bottom) to which the constraint is set up is specified. The part of the layout component which is deemed to be on the logical boundary is also specified. This part does not have to be on the physical extremity of the component. The component's center, or the top/right/left/bottom edge of a component's diffusion or gate or well, etc., are examples of parts that may be said to be on a logical boundary. Any required offset from the constrained logical boundary is specified; if not, this defaults to 0.

Two new artificial nodes called the logical_source and logical_sink are added to the constraint graph. The source and sink continue to represent the lowest position and the highest position in the layout and hence continue to represent the physical boundaries. The new logical_source and logical_sink now represent the logical boundaries. The constraint relationships computed in the next steps between the source and the logical_source and the sink and the logical_sink determine where the logical boundaries are with respect to the physical boundaries.

TABLE I

| | |
|---|---|
| $offset_{left/right/top/bottom} = 0$ | when number of components having LBC to left/right/top/bottom boundary $= 0$ |
| $= Max\{D_1, D_2, ..., D_i\}$ | when $0 < i <=$ number of components having LBC to left/right/top/bottom boundary, and $D_i = Abs(Position(left/right/top/bottom\ edge\ of\ component_i) - Position(reference\ point\ of\ component_i))$ |

Refer to FIGS. 1A–1D and Table I and the desired behavior that the layout designer was trying (unsuccessfully) to get. FIGS. 7A–7B show how the desired behavior can now be had by using Logical Boundary Constraints.

A processing step is added to the compaction process to map user defined logical boundary constraints into the constraint graph over and above the processing done for user defined separation constraints and for design rule separation

| |
|---|
| $Offset_{left} = Max(Abs(Position(left\ edge\ of\ c0) - Position(center\ of\ c0)),$ $Abs(Position(left\ edge\ of\ c1) - Position(center\ of\ c1)))$ $= Abs(Position(left\ edge\ of\ c0) - Position(center\ of\ c0))$ |

Hence, the logical boundary is placed at a distance sufficiently away to accommodate the worst case spacing required.

Also as seen in FIG. 7A, after computing $Offset_{left}$ and placing the logical boundary that distance away from the left constraints. This function maps the user defined logical boundary constraints into equality constraints to the logical_source/logical_sink, each of which is eventually represented in the graph as a pair of Minimum and Maximum constraints.

While the equality constraints are being set up between components constrained by logical boundary constraints and the respective logical source and drain nodes, the algorithm also keeps track of which of the constrained elements requires the most spacing between the node representing the physical boundary and the logical boundary. After all the logical boundary constraints have been processed, the maximum separation required is the weight of the equality constraints which will be set up between the logical and physical source/sink nodes. Hence, by constraining the layout components to the logical source/sink and then constraining the logical source/sink nodes with the actual source/sink nodes by a constraint value equal to the most constraining value, this process makes it possible for the most constraining layout component to be determined "on the fly," permitting a high degree of layout technology independence.

With reference to FIG. 8 and the pseudo-code of Appendix C, logical boundary constraints are implemented as follows. During the graph building process (steps 90-98), the compactor finds out all the logical boundary constraints and groups them according to whether they apply to the left, right, top or bottom logical boundary of the layout. Consider the case of the logical boundary constrained to the bottom logical boundary of the layout. For each such constraint, the compactor will find the distance d(i) from the constraint point on the constrained component to the bottom edge of the element's bounding box. This d(i) is the offset that the bottom logical boundary has with the bottom physical boundary if the component i was the component which determined the bottom physical extent of layout after compaction. Then the compactor takes the maximum of all the d(i) offsets it found and makes that the offset between the bottom logical boundary and the bottom physical boundary. The compactor also adds equality constraints between all the layout components constrained to the logical boundary and the graph node corresponding to the logical boundary in the constraint graph. This process is repeated for the left, right a top boundary constraints as well. After this transformation is applied, the graph solving phase proceeds as before.

Implementation of Grid Constraints

With multiple grid constraints, rather than being limited to only placing objects on the manufacturing grid or placing objects on one router grid, the layout designer is allowed to individually select components to be placed on any grid that is desired. For each of the grid specifications, the layout designer is given a choice of grid reference points—the physical boundary, the logical boundary, a point at a certain distance away from the physical boundary, or a point at a certain distance away from the logical boundary. For each of the grid specifications, the designer can also specify a separate offset from the grid reference point at which the grid starts.

Hence, the grid constraint allows the following to specified:

---

Constrained component
The component to which the constraint is to be applied.
Constrained Reference Point
The reference point on the component which is to be placed on the desired grid.
Different components could use different grid reference points.
Grid Multiple
Size of increments at which the constrained component can be placed.
Grid Offset
The offset from the reference point at which the grid starts
Grid Reference Point
Choice from Physical Boundary
 Logical Boundary
Physical Boundary + user defined distance
Logical Boundary + user defined distance

---

Using the flexibility of this system, the layout designer can now specify to the compactor a manufacturing grid for all layout components, and different grid placements for selected components which would for example be connected to by a router on the MET1 layer and other selected components which would be connected to by a router on the MET2 layer.

Modifications are made to the data structures and algorithms in Appendix A to implement grid constraints in accordance with the invention. These include modification to the Node data structure, a preprocessing step added to the compaction process flow to preprocess grid constraints, modification to long_path_forward to handle the grid constraints and modification to long_path_backward to handle the grid constraints.

In addition, two more members are added to the Node data structure: an offset and a multiple. The 5 offset is a combined offset to be applied during the grid computation. The combined offset is a single number representing the total effect of values of (a) Grid Offset specified by a user to specify the offset of the first grid point from the grid reference point; (b) distance of the grid reference point from the physical or logical boundary; (c) distance between the physical boundary and the logical boundary if the grid reference point has been specified with respect to the logical boundary; and (d) distance between the component's reference point for grid computations and the reference point used to represent the position of the component's node in the graph. The default value of the offset is 0.

The multiple member is defined as the difference between the lowest position in the layout (the position of the source) at which the node eventually is positioned after compaction. The multiple should be a multiple of this number after taking into consideration the required offset. The default value of this data member is equal to the manufacturing grid.

Pseudo-code for the preprocessing step is given in Appendix D. Pseudo-code for the modified long_path_forward and long_path_backward procedures is given in Appendix E. The compaction process with grid constraints is shown in the flowchart of FIG. 8. During the graph building phase (steps 70-80), each graph node corresponding to a layout component constrained by a grid constraint is tagged with a flag which identifies the node as requiring special handling and with a number which identifies the grid multiple of the layout grid on the which this layout component should be (80). During the graph solving phase (steps 82-84), when the compactor is moving graph nodes as close towards the source as it can, if the compactor finds that the node it is moving is a node with a grid constraint, the compactor snaps the new coordinate of the node to a value greater than or equal to the value it otherwise would pick such that dividing the value of the new coordinate of the node by the grid multiple does not leave a remainder. Because this step is integrated into the graph solving phase, design rule correctness is ensured while at the same time making sure that the nodes are on the user defined grid. The use of logical boundaries (step 78) may be combined with grid constraints if desired, or may be omitted.

Implementation of Pre-Compaction Constraints

The user defined constraints available to users of compaction tools are traditionally applied (satisfied by moving components if so necessary) during the compaction process itself. By introducing the concept of pre-compaction constraints, i.e., constraints which are applied prior to compaction, the problem of presenting the compactor with the desired initial topology in layout generator systems can be addressed.

Just as there are user defined Minimum, Maximum, and Equality constraints which are applied during the compaction process, there could be corresponding counterparts (whichever are needed by the system) which would be applied prior to compaction.

The process of applying the Pre-Compaction constraints would not attempt to maintain topology. The purpose of the Pre-Compaction constraints is to set up the initial topology. Trying to maintain the topology just as the compactor does would defeat the purpose of having these new type of constraints in the first place.

The process of applying the Pre-Compaction constraints would not attempt to maintain design rule correctness. The compactor would clean up any violations of separation constraints that may have been created when applying the Pre-Compaction constraints.

The system could continually apply the Pre-Compaction constraints each time any of the constrained components moves and hence give immediate feedback to the layout designer, or it could wait till just before the start of the compaction process to apply these constraints.

During compaction these constraints would be treated by the compaction tool just as it treats the "compaction-time-only" counterparts of these Pre-Compaction constraints.

The Pre-Compaction constraints are applied irrespective of the direction of compaction. Hence all Pre-Compaction constraints would be applied regardless of whether they were to be applied in the X direction or the Y direction and regardless of whether the compaction was to be performed in the left/right/top/bottom direction.

Figure 2A:
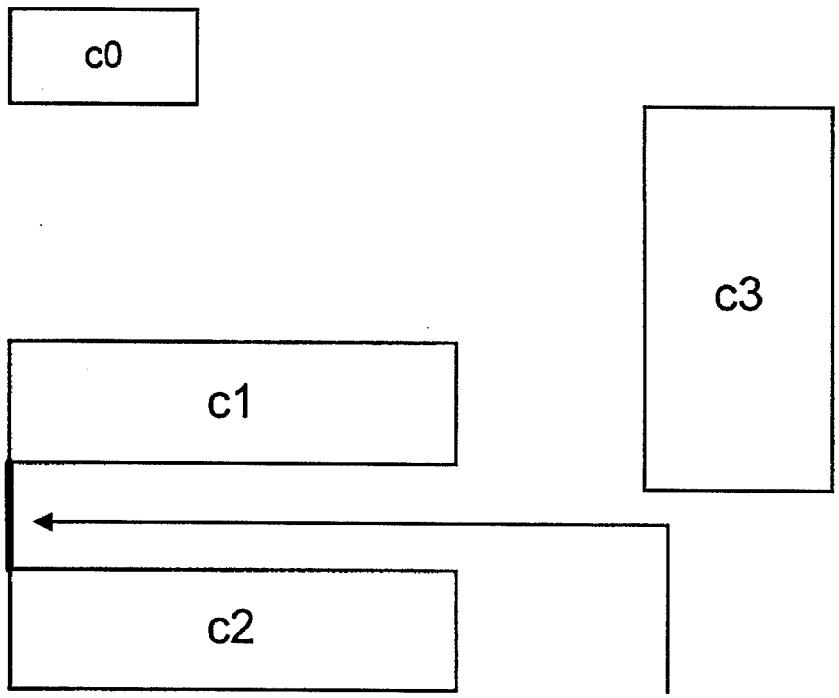
FIGS. 2A–2E show another example of a compaction problem in prior art compactors.
Figure 2B:
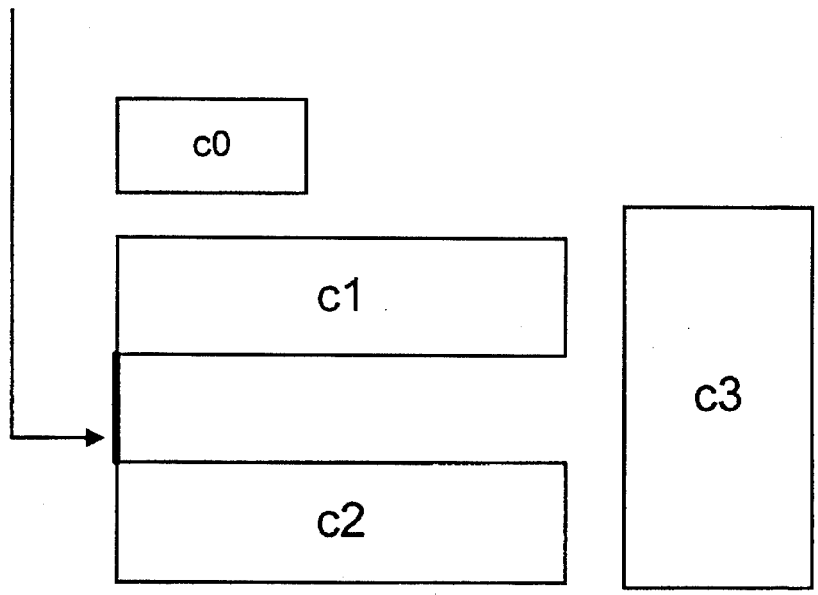
Figure 2C:
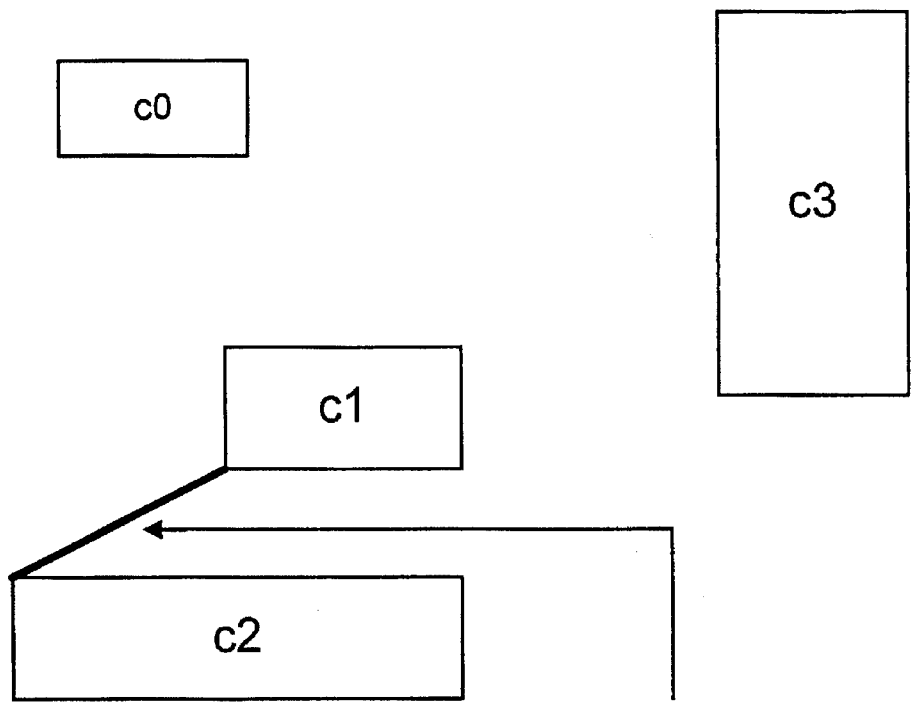
Figure 2D:
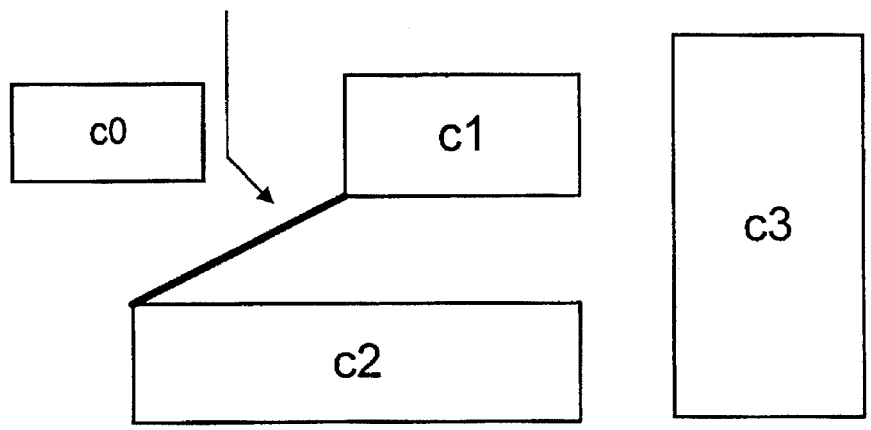
Figure 2E:
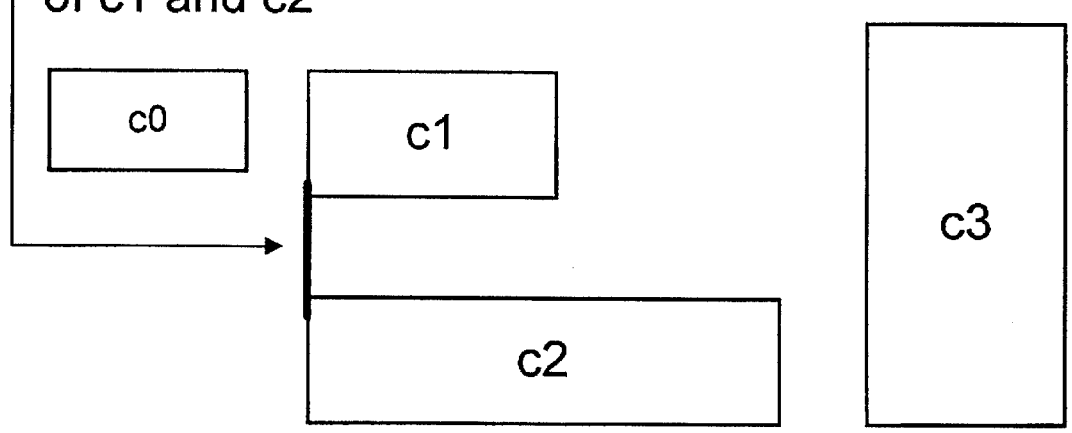

For an example of how the Pre-Compaction constraints would act, refer back to FIGS. 2A and 2B. Assume that corresponding to the Equality constraint, there is also available a Pre-Compaction Equality constraint. The type of the constraint shown in FIG. 2A would now be changed to "Pre-Compaction Equality" instead of "Equality." Because this constraint would be applied prior to compaction irrespective of the direction in which compaction is being performed, even if the size of component C1 were to become smaller because of a change in parameters or porting to a new technology, we would get the desired initial topology shown in FIG. 2B. When this layout is then compacted, because we got the desired initial topology, we would also get the desired compacted result shown in FIG. 2B.

The following steps are taken to implement the Pre-Compaction constraints.

Step 1. Through one of the following three methods, augment the number and types of user-defined constraints available to the layout designer to be applied during the compaction process to also have a corresponding constraint type which is applied prior to compaction and also during compaction. There are various ways in which this can be implemented:

Method 1: For each type of user-defined constraint for which a pre-compaction constraint is desired, implement a data structure which parallels (i.e., has exactly the same data members as that of) the user-defined constraint which is needed to be applied prior to compaction.

Method 2: Augment the data structure of each user-defined constraint to have a field which tells whether the constraint is to be applied prior to compaction or not. For example, in the case of an equality constraint which is applied during compaction only, the data structure would initially look like:

| Equality Constraint: | |
|---|---|
| component_1 | // Identifies the first layout component. During |
| | // compaction, the node corresponding to this component |
| | // would be the node from which the constraint edge would |
| | // start. |
| component_2 | // Identifies the first layout component. During |
| | // compaction, the node corresponding to this component |
| | // would be the node at which the constraint would end. |
| dist | // This is the distance to be maintained between the two |
| | // components. During compaction, this would be the |
| | // weight assigned to the edges corresponding to this |
| | // constraint. |
| | // The relation specified is |
| | // Position(component_2) - Position(component_1) == |
| | // dist |

If the system required, the Pre-Compaction constraints could be set up such that they are applied only prior to compaction and ignored during the compaction process itself.

If an equality constraint that is applied also prior to compaction is needed (call it the Pre-Compaction Alignment constraint), then the data structure would be changed to have one more data member:

```
applied_when    // Default value is 0. If sent to 0, the constraint is
                // applied only during compaction. If the value of this
                // field is 1, the constraint is also applied prior to
                // compaction.
```

Method 3: Exploit the features of an object-oriented language like C++ by defining a common base class to hold the data members necessary to represent the necessary information and define a virtual function to apply the constraint prior to compaction. If the object happens to be a during-compaction-only type of constraint, this virtual function would not do anything, but if the object happens to be a pre-compaction constraint, then the constraint would be applied. This is the preferred method in our implementation.

Step 2. Implement a set of functions to apply (i.e., satisfy) the constraint before the compaction process even starts. This process would be performed without building a constraint graph, without trying to maintain the initial topology, or without trying to ensure that the result of applying the constraint does not violate any spacing rule (separation) constraints. After the initial topology of components is set up by this step, the compaction process would then clean up any spacing constraint violations and reduce the size of the layout while maintaining the desired topology.

Step 3. Interpret the Pre-Compaction constraints in a manner equivalent to that of their corresponding during-compaction-only type of constraints during the compaction process itself. This makes sure that the pre-compaction constraints are not ignored during compaction and that the end result is in accordance with the user-defined constraints. Note that this is possible because the definition of the pre-compaction constraint would specify the same relationship as its during-compaction-only counterpart. Treating the pre-compaction constraints equivalent to the regular user-defined compactions constraints has the benefit that no other modifications are required to the compaction algorithms.

Step 4. If there is a need for a constraint which is applied prior to compaction but not during the compaction process, the steps outlined above can be repeated to make it so that the compactor ignores this constraint during compaction just as in the pre-compaction. For example, in Method 2 above, the behavior can be modified such that if the filed applied_when is set to 2 (values 0 and 1 already have some meaning), then the constraint is applied only prior to compaction and not during compaction.

There are two basic approaches to implement the set of functions to apply the Pre-Compaction constraints.

Approach 1:

A simple pre-process step is executed prior to compaction to move the layout components to satisfy the Pre-Compaction constraints. There would be no visual feedback to the user showing the layout topology when the user is editing the layout because this step does not get executed until just before the compaction process.

```
-Proc apply_pre_compaction_alignment_constraints(Layout 1)
        UserDefined Constraint c
        foreach c all_user_defined_constraints(1)
            if should_be_applied_prior_to_compaction(c) then
                apply_constraint(c)
            endif
        end
end_proc
```

Approach 2:

This approach applies the constraint even when the user is editing the layout. The user can be editing the layout for a long time before he calls the compactor. Yet because this approach applies the constraint whenever an editing operation is performed, the user can get visual feedback of the changes being made. This is the approach adopted in our preferred implementation of the pre-compaction constraints. It is important to note that in this approach, the CAD system in which the constraints are implemented must either directly call this event handler directly each time a component moves or must have the ability to call this event handler indirectly via callback function. The pseudo-code to implement an event handler for approach 2 is:

```
Proc component_position_change_handler(Component comp)
        if is_constrained(comp) then
            UserDefined Constraint c
            foreach c find_constraints_on(comp)
            // there may be more than one constraint on comp
                if should_be_applied_prior_to_compaction(c) then
                    apply_constraint(c)
                endif
            end
        endif
end_proc
```

Implementation of Pre-Compaction Alignment Constraints

Pre-Compaction Alignment constraints are an example of the Pre-Compaction constraints concept. The following steps are taken to implement the Pre-Compaction Alignment constraints:

Using method 3 discussed above, use a common C++ base class to hold the data members common to the Equality Constraint which is a user-defined constraint that is applied only during compaction, and the Alignment constraint which is also a user-defined constraint which is applied both prior to compaction and during compaction. The data members of this common data structure are:

```
component_1    // Identifies the first layout component. During compaction, the
               // node corresponding to this component would be the node from
               // which the constraint edge would start.
component_2    // Identifies the second layout component. During
               // compaction, the node corresponding to this component
               // would be the node at which the constraint edge would end.
dist           // This is the distance to be maintained between the two
               // components. During compaction, this would be the weight
               // assigned to the edges corresponding to this constraint.
               // The relation specified is
               // Position(component_2) - Position(component_1) == dist
               // The same relationship holds true also if the constraint is
               // applied prior to compaction.
```

Implement code to apply (i.e., satisfy) the constraint even before the compaction process starts. This process would be performed without building a constraint graph, without trying to maintain the initial topology, or without trying to ensure that the result of applying the constraint does not violate any spacing rule (separation) constraints. After the initial topology of components is set up by this step, the compaction process would then clean up any spacing constraint violations and reduce the size of the layout while maintaining the desired topology.

Interpret the Pre-Compaction Alignment constraints in a manner equivalent to that of Equality constraints during the compaction process itself. This makes sure that the Pre-Compaction Alignment Constraint is not ignored during compaction and that the end result is in accordance with the user-defined constraints. Note that this is possible because the definition of the Pre-Compaction Alignment constraint specifies the same relationship between the component as that specified by the Equality constraint. Moreover, treating the Pre-Compaction Alignment constraints equivalent to Equality constraints has the benefit that no other modifications are required to the compaction algorithms.

As described above, two approaches can be taken to implement the set of functions to apply the Pre-Compaction constraints. The preferred implementation uses the second approach to define an event handler which is called every time a layout component is moved. The event handler checks to see if a component which is moved is constrained by a user-defined pre-compaction alignment constraint; if it finds that to be the case, then it applies the pre-compaction alignment constraint.

```
Proc pre_compaction_move_event_handler(Component comp)
        if is_constraint(comp) then
            UserDefinedConstraint c
            foreach c find_constraints_on(comp)
                        // there may be more than one constraint on comp
                        if should_be_applied_prior_to_compaction(c) then
                            apply_constraint(c)
                        // If this constraint happens to be a precompaction constraint, then
                        // apply_constraint call actually moves layout components if it needs to
                        // keep the constraint satisfied. If the constraint happens to be one of the
                        // other user-defined compaction-time-only (e.g., Minimum, Maximum)
                        // constraints, then the apply_constraint call is a NOP (no operation). This
                        // is done by using virtual functions in C ++.
            endif
        end
    endif
end_proc
```

Having illustrated and described the principles of the invention in a preferred embodiment, it should be apparent to those skilled in the art that the embodiment can be modified in arrangement and detail without departing from such principles. In view of the many possible embodiments to which the principles of our invention may be applied, it should be recognized that the illustrated embodiment is only a preferred example of the invention and should not be taken as a limitation on the scope of the invention. Rather, the invention is defined by the following claims. I therefore claim as my invention all that comes within the scope and spirit of these claims.

APPENDIX A

Pseudo-code for a Method to Solve the Graph

```
Node:
            low_position        //Current position of the node. This value changes during
                                //compaction to minimize the distance from the source.
            high_position       //Not used unless wire length minimization is to be performed.
                                //When used, this value changes during compaction to the
                                //maximum value it can be without increasing the distance between
                                //the source and sink nodes.
            out_min_edges       //Directed minimum constraint edges leaving this
            in_min_edges        //Directed minimum constraint edges coming into this node
            out_max_edges       //Directed maximum constraint edges leaving this node
            in_max_edges        //Directed maximum constraint edges coming into this node
            degree              //Holds the number of inward edges still to be processed
Edge:
            succ_node           //node on which the constraint ends
            pred_node           //node from which the constraint starts
            weight              //constraint value
Graph:
            node_list           //list of all nodes in the graph
            edge_list           //list of all edges in the graph
//subroutine called from solve_forward
procedure long_path_forward(Graph g)
            Queue q     //create an empty queue
            q.enque(source_node(g))       //start with the graph's source node
            while is_not-empty(q)
            Node n = dequeue(q)
            Edge e
            foreach e in n.out_min_edges
            //outward edges are constraint arcs going out of this node
            Node succ = e.succ_node       //successor node of edge e
            succ.low_position = max(succ.low_position,n.low_position+e.weight)
            succ.degree = succ.degree -1
            if succ.degree == 0 then
                enqueue(q.succ)
            endif
      end
  end
end_proc
//subroutine called from solve_forward to initiate degree of nodes
procedure initialize_in_degree_of_nodes(Graph g)
    Node n
    foreach n in g.node_list
                n.degree = number_of_inward_minimum_edges(n)
                // inward edges are constraint arcs
                // coming into the node
    end
end_proc
procedure solve_forward(Graph g)
    Node s = source(g)
    Node n
    for each n in g.node_list
                n.low_position = source.low_position
                //initialize each node to the same value as source value
    end
    max_iterations = number_of_maximum_constraints(g)+1
    iteration_count = 0
    flag = 1
    while max_iterations > 0 && flag == 1
    iteration_count = iteration_count +1
    if iteration_count > max_iterations then
                //Overconstrained graph
                return error status //issue diagnostic message here and return error code
    endif
    initialize_in_degree_of_nodes(g)
    long_path_forward(g) //solve the acyclic part of the graph
    flag = 0
    Edge e
    foreach e maximum_constraints_in_graph(g)
                //verify that max constraints are satisfied
```

APPENDIX A-continued

Pseudo-code for a Method to Solve the Graph

```
                if e.succ_node.low_position - e.pred_node.low_position > e.weight then
                //Maximum constraint not satisfied. Move predecessor node to satisfy the
                //constraint.
                        e.pred_node.low_position = e.succ_node.low_position -e.weight
                        flag = 1    //need to iterate again to make sure that this change
                                    //did not violate any Minimum constraint
                endif
        end
    end
    return         //graph solved forward successfully
end_proc
//subroutine called from solve_backward
procedure long_path_backward(Graph g)
    Queue q        //create an empty queue
    q.enque(sink_node(g))    //start with the graph's sink node
    while is_not_empty(q)
    Node n = dequeue(q)
    Edge e
    foreach e in n.in_min_edges
                //inward edges are constraint arcs coming into this node
                Node succ = e.pred_node //predecessor node of edge e
                pred.high_position = min(pred.high_position.n.high_position - e.weight)
                pred.degree = succ.degree -1
                if pred. degree == 0 then
                        enqueue(q.pred)
                endif
        end
    end
end_proc
//subroutine called from solve_backward to initialize degree of nodes
procedure initialize_out_degree_of_nodes(Graph g)
    Node n
    foreach n in g.node_list
                n.degree = number_of_outward_minimum_edges(n)
                //outward edges are constraint arcs going out of this node
        end
end_proc
procedure solve_backward(Graph g)
    Node s = sink(g)
    Node n
    foreach n in g.node_list
                n.high_position = source.high_position
                //initialize each node to the same value as sink value
        end
    max_iterations = number_of_maximum_constraints(g) + 1
    iteration_count = 0
    flag = 1
    while max_iterations > 0 && flag == 1
                iteration_count = iteration_count + 1
                if iteration_count > max)iterations then
                        //Overconstrained graph
                        return error status //issue diagnostic message here and error code
                endif
                initialize_out_degree_of_nodes(g)
                long_path_backward(g)       //solve the acyclic part of the graph in backward
                                            //direction
                flag = 0
                Edge e
                foreach e maximum_constraints_in_graph(g)
                        //verify that max constraints are satisfied
                        if e.succ_node.low_position - e.pred_node.low_position > e.weight then
                                //Maximum constraint not satisfied. Move high position of
                                //successor node to satisfy the constraint.
                        e.succ node.high_position = e.pred_node.high_position + e.weight
                        flag = 1        //need to iterate again to make sure that this change
                                        //did not violate any Minimum constraint
                endif
            end
        end
    return         //graph solved backward successfully
end_proc
procedure solve (Graph g)
    if solve_forward(g) failed then
        return error status
    endif
    If solve_backward(g) failed then
        return error status
```

APPENDIX A-continued

Pseudo-code for a Method to Solve the Graph

```
        endif
        return success status
end_proc
```

APPENDIX B

Pseudo-code for Implementing Physical Boundary Constraints

```
proc pre_process_physical_boundary_constraints(Layout layout, Direction d Graph g)
    //The data structures employed by the layout database to represent information in the
    //input layout can (and do) vary from one CAD system to another. The exact data
    //structures do not matter as long as the database can support the look up of user defined
    //boundary constraints.
    //
    //Direction d is the direction in which compaction is to be performed -- down/left/right/up.
    //When compacting up/down, constraints to left and right boundaries are ignored. Similarly,
    //When compacting right/left, constraints to top and left boundaries are ignored.
    //To avoid unnecessary complexity in understanding the processing step, this function
    //assumes that the compaction is being performed in the down direction. The algorithm can
    //be trivially extended to compactions in other directions by duplicating this logic for each
    //of those cases.
    User_physical_boundary_spec pbnd      //implementation dependent data structure to get
information
                                          //out of the database
    foreach pbnd in all_user_defined_physical_boundary_constraints_to_top_and_bottom(layout)
        //look up the database to find constraints to top and bottom boundaries
        if (pbnd.component_side ! =top) || (pbnd.component_side ! = bottom) then
            //illegal constraint specification. Cannot constrain right/left side of a component
            //to a top/bottom boundary.
            return error status
        endif
        if pbnd.component_side == top then
            Node sink = sink_node(g)
            Node n = find_node (g.pbnd.component)
            //find the node in the graph corresponding to for the layout component
            Edge min = new_edge( )      //create new edges to add between graph nodes
            Edge max = new_edge( )
            min.pred_node = n
            min.succ_node = sink
            min.weight = pbnd.offset
            add_edge(g.min)
            add_out_min_edge(n.min)
            add_in_min_edge(sink.min)
            max.pred_node = n
            max.sind_node = sink
            max.weight = pbnd.offset
            add_edge(g.max)
            add_out_max_edge(n.max)
            add_in_max_edge(sink.max)
        else
            Node source = source_node(g)
            Node n = find_node(g.pbnd.component)
            //find the node in the graph corresponding to for the layout component
            Edge min = new_edge( )      //create new edges to add to add between graph
                                        //nodes
            Edge max = new_edge( )
            min.pred_node = source
            min.succ_node = n
            min.weight = pbnd.offset
            add_edge(g.min)
            add_out_min_edge(source.min)
            add_in_min_edge(n.min)
            max.pred_node = source
            max.sink_node - n
            max.weight = pbnd.offset
            add_edge(g.max)
            add_out_max_edge(source.max)
            add_in_max_edge(n.max)
        endif
    end
end_proc
```

APPENDIX C

Pseudo-code for Implementing Logical Boundary Constraints

```
Proc   pre_process_logical_boundary_constraints (Layout layout, Direction d, Graph g)
    //The data structures employed by the layout database to represent information in the
    //input layout can (and do) vary from one CAD system to another. The exact data
    //structures do not matter as long as the database can support the look up of user-defined
    //boundary constraints.
    //
    //Direction d is the direction in which conpaction is to be performed--down/left/right/up.
    //When compacting up/down, constraints to left and right boundaries are ignored. Similarly,
    //When compacting right/left, constraints to top and left boundaries are ignored.
    //To avoid unnecessary complexity in understanding the processing step, this function-ok?
    //assumes that the compaction is being performed in the down direction. The algorithm can
    //be trivially extended to compactions in other directions by duplicating this logic for each
    //of those cases.
User_logical_boundary_spec lbnd      //implementation dependent data structure to
                                     //get information out of the database
Separation_of_logical_source_from_source = 0
Separation_of_logical_sink_from_sink = 0
        //These two variables will be used to compute the required separation between the
        //logical source/sink and the physical source/sink nodes.
        foreach lbnd in all_user_defined_logical_boundary_constraints_to_top_and_bottom(layout)
        //look up the database to find constraints to top and bottom boundaries
        if lbnd.component_side == top then
            sink_offset = lbnd.component.bounding_box.upper_right.y-lbnd.constrained_part.y
            separation_of_logical_sink_from_sink =
                            max (separation_of_logical_sink_from_sink.sink_offset)
            Node logical_sink = logical_sink_node(g)
            Node n = find_node(g.lbnd.component)
            //find the node in the graph corresponding to for--? the layout component
            Edge min = new_edge( ) //create new edges to add between graph notes
            Edge max = new_edge( )
            min.pred_node = n
            min.succ_node - logical_sink
            add_edge(g.min)
            add_out_min_edge(n.min)
            add_in_min_edge(logical_sink.min)
            max-pred_node = n
            max.sink_node = logical-sink
            max.weight = lbnd.offset
            add_edge(g.max)
            add_out_max_edge (n.max)
            ad_in_max_edge(logical_sink.max)
        else
            source_offset - lbnd.component.bound_box.lower_left.6 - lbnd. constrained_part.y
            separation_of_logical_source_from_source =
                                max(separation_of_logical_source_from_source.source_offset)
            Node source = logical_source_node(g)
            Node n = find_node(g.lbnd.component)
            //find the node in the graph corresponding to for the layout component
            Edge min - new_edge( ) //create new edges to add to add between graph nodes
            Edge max = new_edge( )
            min.pred_node = logical_source
            min.succ_node = n
            min.weight = lbnd.offset
            add_edge(g.min)
            add_out_min_edge(logical_source.min)
            add_in_min_edge(n.min)
            max.pred_node = locical_source
            max.sink_node - n
            max.weight = lbnd.offset
            add_edge(g.max)
            add_out_max_edge(logical_source.max)
            add_in_max_edge(n.max)
        endif
end
    //now add the constraints to maintain the required relative positions of the source
    //and sink nodes.
    Edge source_min = new_edge( )
    Edge source_max = new_edge
    source_min.pred_node = source_node(g)
    source_min.succ_node = logical_source_node(g)
    source_min.weight = separation_of_logical_source_from_source
    add_edge(g.source_min)
    add_out_min_edge(source.source_min)
    add_in_min_edge(logical_source.source_min)
    source_max.pred_node = source_node(g)
    source_max.succ_mode = logical_source_node(g)
```

APPENDIX C-continued

Pseudo-code for Implementing Logical Boundary Constraints

```
        source_max.weight = separation_of_logical_source_from_source
        add_edge(g.source_max)
        add_out_max_edge(source.source_max)
        add_in_max_edge(logical_source.source_max)
        Edge sink_min = new_edge(f)
        Edge sink_max = new_edge
        sink_min.pred_node = logical_sink_node(g)
        sink_min.succ_node = sink_node(g)
        sink_min.weight = separation_of_logical_sink_from_sink
        add_edge(g.sink_min)
        add_out_min_edge(logical_sink.sink_min)
        add_in_min_edge(sink.sink_min)
        sink_max.pred_node = logical_sink_node(g)
        sink_max.succ_node = sink_node(g)
        sink_max.weight = separation_of_logical_sink_from_sink
        add_edge(g.sink_max)
        add_out_max_edge(logical_sink.sink_max)
        add_in_max_edge(sink.sink_max)
end_proc
```

APPENDIX D

Pseudo-code for the Grid Constraint Preprocessing Step

```
procedure pre_process_constraints (Layout1, Graph g, Direction d)
        dist_between_logical_source_and_source =
                                (logical_source(g).position_source(g).position)
        offset_of_grid_reference_from_boundary = get_grid_ref_offset(1)
        GridConstraintSpec grid
        foreach grid in all_user_defined_grid_constraints_in(1, d)
                //find the user defined grid specifications from the layout which are applicable
                //to the direction compaction is being performed int.
                if (grid.multiple modulus manufacturing_grid) != 0 then
                        //user defined grid multiple must be a multiple of the manufacturing
                        //grid.
                        Log error message
                        Skip this grid constraint specification
                endif
                if (grid. grid_offset modulus manufacturing_grid) ! =0 then
                        //grid_offset must be a multiple of the manufacturing grid. Otherwise
                        //component would end up placed off manufacturing grid
                        Log error message
                        Skip this grid constraint specification
                endif
                combined_grid_offset = 0   //default value is zero
                combined_grid_offset = combined_grid_offset + grid.grid_offset
                        //1st component taken care of
                        //This is the user specified offset from grid reference point to first grid.
                combined_grid_offset = combined_grid_offset + offset_grid_ref_from_boundary
                        //2nd component taken care of.
                        //The user can set up grid reference point at a distance away from a boundary.
                if grid.is_from_logical_boundary then
                        combined_grid_offset = combined_grid_offset +
                                        dist_between_logical_source_and_source
                        //3rd component taken care of.
                        //Grid reference point is set up with respect to the logical boundary.
                endif
                combined_grid_offset = combined_grid_offset +
                                (position(grid.grid_ref_pint) - position(grid.component)
                        //4th component taken care of.
                        //This is the distance between the reference point used for grid computation
                        //and the reference point used for the component's position in the graph
        Node n
        n = find_node(g, grid.component) //find the graph node corresponding to the component
        n.multiple = grid.multiple
        n.offset = combined_offset
end_proc
```

APPENDIX E

Pseudo-code for Implementing the Grid Constraints

```
//Subroutine called from solve_forward. Modified for Grid constraints.
    Procedure long_path_forward(Graph g)
    Queue q        //Create an empty queue
    q.enque source_node(g)) //start with the graph's source node
    while is_not_empty(q)
        Node n = dequeue(q)
        Edge e
        foreach e in n.out_min_edges
            //outward edges are constraint arcs going out of this node
            Node succ = e.succ node      //successor node of edge.e
            unsnapped_value = max(succ.low_position.n.low_position + e.weight)
            if n.multiple == 1 then
                snapped_value = unsnapped_value
            else
                temp_val = unsnapped_value + offset - source_node(g).low_position
                //The following modulus operation makes sense only if the value of the
                //position is with reference to the coordinate value of 0. However, the
                //highest position of the layout (i.e., the low_position of the source node)
                //need not be at 0. Hence it is very important to subtract the source node's
                //coordinate to "normalize" this number.
                remainder = temp_val modulus multiple
                if remainder == 0 then
                    snapped_value = unsnapped_value
                else
                    snapped_value = unsnapped_value + (multiple - remainder)
                endif
            endif
            succ.low_position = snapped_value
            succ.degree = succ.degree - 1
            if succ. degree == 0 then
                enqueue(q.succ)
            endif
        end
    end
end_proc
//Subroutine called from solve_backkward. Modified for Grid constraints.
procedure long_path_backward(Graph g)
    Queue q        //create an empty queue
    q.enque(sink_node(g))    //start with the graph's sink node
    while is_not_empty(q)
        Node n = dequeue(q)
        Edge e
        foreach e in n.in_min_edges
            //inward edges are constraint arcs coming into this node
            Node Pred = e.pred_node         //predecessor node of edge e
            unsnapped_value = min(pred.high_position.n.high_position - e.weight)
            if n.multiple == 1 then
                snapped_value=unsnapped_value
            else
                temp_val = unsnapped_value + offset - source_node(g).low_position
                //The following modulus operation makes sense only if the value of the
                //position is with reference to the coordinate value of 0. However, the
                //highest position of the layout (i.e., the high_position of the source node)
                //need not be at 0. Hence, it is very important to subtract the source
                //node's coordinate to "normalize" this number.
                remainder = temp_val modulus multiple
                if remainder == 0 then
                    snapped_value = unsnapped_value
                else
                    snapped_value = unsnapped_value - remainder)
                endif
            endif
            pred.high_position = snapped_value
            pred.degree = succ.degree -1
            if pred.degree == 0 then
                enque(q.pred)
            endif
        end
    end
end_proc
```

I claim:

1. A computer-implemented method of constraining compaction of components of a circuit layout, the method comprising the following steps:

determining constraint reference points for at least two constrained components;

determining which of the two constrained components has a greatest distance between the components constraint reference point and a specified component edge;

storing the greatest distance as a logical layout boundary that is offset from a specified physical layout boundary; and in compacting the constrained components, aligning the reference points of the constrained components with the logical layout boundary to prevent each of the constrained components from extending beyond the physical layout boundary.

2. The method of claim 1 wherein the component edge and physical layout boundary are specified by a user.

3. The method of claim 1 wherein the component edge and physical layout boundary are specified by a computer.

4. The method of claim 1 wherein multiple offsets are stored for multiple pairs of constrained components, and the method includes selecting the largest offset as the logical layout boundary.

5. The method of claim 1 wherein a reference point of a constrained component the components its center.

6. The method of claim 1 where in the reference points of the two constrained components are different.

7. A computer-readable medium on which is stored a computer program comprising instructions which when executed by a computer perform the method of claim 1.

8. A computer-implemented method of constraining components of an circuit layout prior to compaction, the method comprising the following steps:

storing a pre-compaction constraint for a component;

storing at least one compaction-only constraint for the circuit layout, said circuit layout including a plurality of components;

applying the pre-compaction constraint to the component;

applying said at least one compaction-only constraint to compact the circuit layout; and maintaining the application of the pre-compaction constraint on the component during compaction of the circuit layout to be consistent with the at least one compaction-only constraint application.

9. The method of claim 8 wherein the step of storing a pre-compaction constraint comprises adding a data structure in memory for storing the constraint.

10. The method of claim 8 wherein the step of storing a pre-compaction constraint comprises augmenting an existing data structure in memory for storing the constraint.

11. The method of claim 8 wherein the step of storing a pre-compaction constraint comprises defining a common base class to hold the precompaction constraint.

12. The method of claim 8 where the step of applying a precompaction constraint comprises implementing a set of functions to apply the pre-compaction constraint before a compaction process begins.

13. The method of claim 12 wherein the functions are implemented just prior to the compaction process.

14. The method of claim 12 wherein the functions are implemented as the components are edited.

15. A computer-readable medium on which is stored a computer program comprising instructions which when executed by a computer perform the method of claim 8.

16. A circuit design apparatus for constraining compaction of components, comprising;

means for determining constraint reference points for at least two constrained components;

means for determining which of the two constrained components has a greatest distance between the component's constraint reference point and a specified component edge;

means for storing the greatest distance as a logical layout boundary offset from a specified physical layout boundary; and means for aligning the reference points of the constrained components with the logical layout boundary to prevent each of the constrained components from extending beyond the physical layout boundary.

17. The apparatus of claim 16 including means for providing a multiple number of grid constraints for components.

18. The apparatus of claim 16 including means for applying a pre-compaction constraint to a component.

19. A computer-implemented method of constraining compaction of components of a circuit layout, the method comprising the following steps:

providing a multiple number of grids as individual constraints for components;

for each grid constraint, providing a number of grid reference points; and applying a grid constraint to a component, the constrained component thereby constrained according to the individually applied grid.

* * * * *

UNITED STATES PATENT AND TRADEMARK OFFICE
CERTIFICATE OF CORRECTION

PATENT NO. : 5,636,132
DATED : June 3, 1997
INVENTOR(S) : Ajay D. Kamdar

It is certified that error appears in the above-identified patent and that said Letters Patent is hereby corrected as shown below:

| Col./Line | Error Reads | Should Read |
|---|---|---|
| 29/21 | the components its | is the component's |
| 29/2 | components | component's |
| 30/16 | comprising; | comprising: |

Signed and Sealed this

Twenty-fourth Day of November, 1998

Attest:

BRUCE LEHMAN

Attesting Officer     Commissioner of Patents and Trademarks